United States Patent
Ohta et al.

(10) Patent No.: US 8,999,286 B2
(45) Date of Patent: Apr. 7, 2015

(54) METHOD FOR PRODUCING GRAPHITE FILM AND METHOD FOR PRODUCING CARBONIZED FILM

(75) Inventors: Yusuke Ohta, Settsu (JP); Takashi Inada, Settsu (JP); Makoto Mishiro, Settsu (JP); Yasushi Nishikawa, Settsu (JP)

(73) Assignee: Kaneka Corporation, Osaka-Shi (JP)

( * ) Notice: Subject to any disclaimer, the term of this patent is extended or adjusted under 35 U.S.C. 154(b) by 0 days.

(21) Appl. No.: 14/005,423

(22) PCT Filed: Mar. 15, 2012

(86) PCT No.: PCT/JP2012/056778
§ 371 (c)(1),
(2), (4) Date: Sep. 16, 2013

(87) PCT Pub. No.: WO2012/128187
PCT Pub. Date: Sep. 27, 2012

(65) Prior Publication Data
US 2014/0004033 A1 Jan. 2, 2014

(30) Foreign Application Priority Data
Mar. 18, 2011 (JP) ................................. 2011-061495

(51) Int. Cl.
| | |
|---|---|
| C01B 31/02 | (2006.01) |
| C01B 31/04 | (2006.01) |
| H01L 23/373 | (2006.01) |
| C04B 35/52 | (2006.01) |
| C04B 35/524 | (2006.01) |
| C04B 35/622 | (2006.01) |

(52) U.S. Cl.
CPC .................. *C01B 31/04* (2013.01); *C01B 31/02* (2013.01); *H01L 23/373* (2013.01); *C04B 35/522* (2013.01); *C04B 35/524* (2013.01); *C04B 35/62218* (2013.01); *H01L 2924/0002* (2013.01)

(58) Field of Classification Search
CPC ...... C01B 31/04; C01B 31/02; H01L 23/373; C04B 35/522; C04B 35/524; C04B 35/536; C04B 35/62218
USPC .................................................. 423/448, 460
See application file for complete search history.

(56) References Cited

U.S. PATENT DOCUMENTS

| | | | | |
|---|---|---|---|---|
| 3,528,774 | A | * | 9/1970 | Ezekiel et al. ............. 423/447.6 |
| 4,005,183 | A | * | 1/1977 | Singer ....................... 423/447.2 |

FOREIGN PATENT DOCUMENTS

| | | |
|---|---|---|
| JP | 4-149013 A | 5/1992 |
| JP | 2002-33107 A | 1/2002 |

(Continued)

OTHER PUBLICATIONS

International Search Report, issued in PCT/JP2012/056778, dated May 22, 2012.

(Continued)

*Primary Examiner* — Richard M Rump
(74) *Attorney, Agent, or Firm* — Birch, Stewart, Kolasch & Birch, LLP

(57) ABSTRACT

A graphite film with fewer wrinkles and/or undulations is obtained providing two or more stages of heating space and carrying out continuous baking. Especially when a cooling space is provided between each of the heating spaces and another, a graphite film can be obtained which is excellent in flatness and has a high thermal diffusivity.

12 Claims, 3 Drawing Sheets

(56) References Cited

FOREIGN PATENT DOCUMENTS

| JP | 2003-165714 A | 6/2003 |
| JP | 2003-165715 A | 6/2003 |
| JP | 2008-88050 A | 4/2008 |
| JP | 2008-254937 A | 10/2008 |
| JP | 2009-292694 A | 12/2009 |
| JP | 2010-64949 A | 3/2010 |
| JP | 2010-132557 A | 3/2010 |

OTHER PUBLICATIONS

International Preliminary Report on Patentability, and Translation of Written Opinion of the International Searching Authority, dated Oct. 3, 2013, for International Application No. PCT/JP2012/056778 (Forms PCT/IB/338, PCT/IB/373 and PCT/ISA/237).

* cited by examiner

METHOD FOR PRODUCING GRAPHITE FILM AND METHOD FOR PRODUCING CARBONIZED FILM

TECHNICAL FIELD

The present invention relates to a method for producing a graphite film and a method for producing a carbonized film, the methods each including a continuous carbonization step of continuously baking a polymer film that continues lengthwise.

BACKGROUND ART

Polymer-baking types of graphite films have excellent heat-dissipating properties, and as such, are used as heat-dissipating components for dissipating heat from components that generates heat, e.g., for semiconductor elements that are mounted in various electronic or electrical apparatuses such as computers. A conventional method for producing a graphite film has included heat-treating sheets of polymer film in batch-wise manner. However, in order to improve productivity or in order to produce a long graphite film, a method for continuously baking a polymer film that continues lengthwise has been developed. For example, Patent Literature 1 discloses a method for continuously baking a long polymer film while applying tension to the polymer film, and Patent Literature 2 discloses a method for continuously baking a long polymer film while applying as little tension as possible to the polymer film.

CITATION LIST

Patent Literature 1
Japanese Patent Application Publication, Tokukaihei, No. 4-149013 A (Publication Date: May 22, 1992)
Patent Literature 2
Japanese Patent Application Publication, Tokukai, No. 2004-299937 A (Publication Date: Oct. 28, 2004)

SUMMARY OF INVENTION

Technical Problem

With the method of Patent Literature 1 or 2, it has been difficult to wind the resulting carbonized film, because the resulting carbonized film becomes fragile as a result of carbonization, which shrinks the polymer film and thereby would possibly cause wrinkle and/or undulation (see FIG. 1) that easily lead to cracks in the resulting carbonized film.

The present invention is intended to solve such problems, and has as an object to provide a method for producing a graphite film and a method for producing a carbonized film, in which methods wrinkling of a polymer film as a result of continuous baking is reduced.

Solution to Problem

That is, the present invention relates to a method for producing a graphite film, the method including a continuous carbonization step that includes two or more heating spaces (claim 1), and relates to a method for producing a carbonized film, the method including a continuous carbonization step that includes two or more heating spaces (claim 8).

Advantageous Effects of Invention

According to the present invention, the method for producing a graphite film and the method for producing a carbonized film make it possible to reduce the wrinkling in a polymer film, which wrinkling is caused due to the continuous carbonization step.

DESCRIPTION OF EMBODIMENTS

Figure 1:
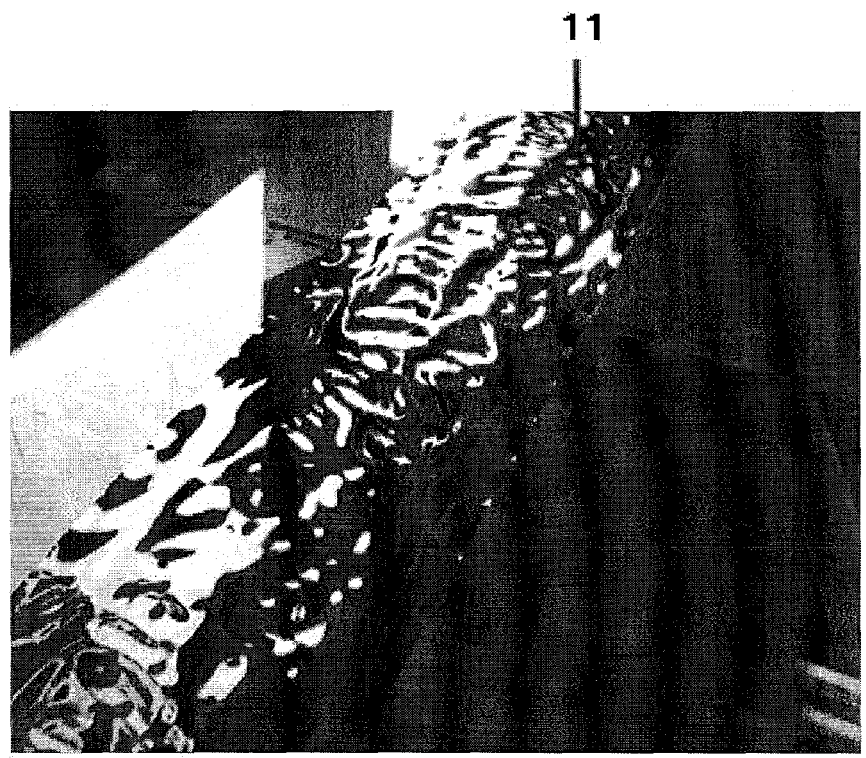
FIG. 1 is a photograph showing a carbonized film heat-treated by a conventional continuous baking method.

The present invention relates to a method for producing a graphite film, the method including a continuous carbonization step that includes two or more heating spaces, and relates to a method for producing a carbonized film, the method including a continuous carbonization step that includes two or more heating spaces. The method for producing a graphite film means a method for producing a graphite film, the method including a continuous carbonization step that includes two or more heating spaces, and the method for producing a carbonized film means a method for producing a carbonized film, the method including a continuous carbonization step that includes two or more heating spaces.

With the method of the present invention for producing a graphite film, a graphite film is produced by heat-treating a polymer film. As for the continuous carbonization step, the method may include a carbonization step and a graphitization step as well as the continuous carbonization step, or may include a graphitization step as well as the continuous carbonization step.

Meanwhile, with the method of the present invention for producing a carbonized film, a carbonized film is produced by heat-treating a polymer film. The production method may include a carbonization step as well as the continuous carbonization step, or may include the continuous carbonization step without including a carbonization step.

A target object to be heat-treated in the continuous carbonization step is a polymer film or a carbonized film (that is, in the continuous carbonization step, a polymer film or a carbonized film is heat-treated). The term "carbonized film" encompasses a polymer film whose weight has started to decrease (or whose weight has decreased) due to heating. That is, in the continuous carbonization step, an unheated polymer film may be heat-treated, or a polymer film which has been heated, so that its weight has decreased may be heat-treated.

In the continuous carbonization step, the polymer film shrinks through decomposition, with the result that the resulting carbonized film, obtained by carbonizing the polymer film, becomes so fragile to easily get wrinkles and/or cracks. In the present invention, it is preferable to execute the continuous carbonization step at two or more stages, for heating the polymer film in a temperature range of not lower than 500° C. to lower than 1000° C. within which temperate range the polymer film undergoes especially severe shrinkage.

The provision of the continuous carbonization step that includes two or more heating spaces makes it possible to reduce the amount that the carbonized film shrinks at each stage and to thereby down-control the wrinkles and/or cracks.

<Starting Temperature of Thermal Decomposition and Ending Temperature of Thermal Decomposition>

It is preferable that the continuous carbonization step of the present invention be executed in a temperature range of not lower than a starting temperature of thermal decomposition of a polymer film to lower than an ending temperature thermal decomposition of the polymer film. The wrinkling and/or cracking can be reduced by multi-staging the heat-treating of the polymer film, which heating treating thermally decomposes the polymer film in the temperature range of not lower than the starting temperature of thermal decomposition of the polymer film to lower than the ending temperature of thermal decomposition of the polymer film. Further, the heat treatment of the polymer film at two or more stages makes it easy for the resulting graphite film to have a high thermal diffusivity after graphitization.

The starting temperature of thermal decomposition of the polymer film and the ending temperature of thermal decomposition of the polymer film are actual temperatures of the polymer film itself being heat-treated. The actual temperature of the polymer film itself can be measured by using a 0.5 mm diameter sheathed K thermocouple brought into contact with the polymer film.

It should be noted that the heat-treating is not particularly limited as to heat treatment conditions regarding a temperature below the starting temperature of thermal decomposition of the polymer film, and regarding a temperature above the ending temperature of thermal decomposition of the polymer film.

The term "starting temperature of thermal decomposition of a polymer film" here is defined as a temperature at which the polymer film loses 1.0% of its initial weight as a result of heat treatment or, specifically, is defined as a temperature at which a 10 mg sample of the polymer film loses 1.0% of its weight as a result of heat treatment carried out at a rate of temperature rise of 10° C./min from room temperature (23° C.) to 1000° C. in a flowing nitrogen atmosphere (200 mL/min) by using a thermal analysis system EXSTAR6000 and a thermogravimetric apparatus TG/DTA 220U (both manufactured by SII Nanotechnology, Inc.).

In the case of the polyimide films (Apical AH, available from Kaneka Corporation in a thickness of 75 μm; Apical NPI, available from Kaneka Corporation in thicknesses of 50, 75, and 125 μm), the polyparaphenylene oxadiazole film (75 μm thick), and the poly(paraphenylene vinylene) film (75 μm thick), which were used in Examples of the present invention, the starting temperature of thermal decomposition of the polymer film is 500° C. The starting temperature of thermal decomposition of the polymer film was measured as defined above.

Further, the term "ending temperature of thermal decomposition of a polymer film" is defined as a temperature at which the polymer film loses 50.0% of its initial weight as a result of heat treatment or, specifically, is defined as a temperature at which a 10 mg sample of the polymer film loses 50.0% of its weight as a result of heat treatment carried out at a rate of temperature rise of 10° C./min from room temperature (23° C.) to 1000° C. in a flowing nitrogen atmosphere (200 mL/min) by using a thermal analysis system EXSTAR6000 and a thermogravimetric apparatus TG/DTA 220U (both manufactured by SII Nanotechnology, Inc.).

In the case of the polyimide films (Apical AH, available from Kaneka Corporation in a thickness of 75 μm; Apical NPI, available from Kaneka Corporation in thicknesses of 50, 75, and 125 μm), the polyparaphenylene oxadiazole film (75 μm thick), and the poly(paraphenylene vinylene) film (75 μm thick), which were used in Examples of the present invention, the ending temperature of thermal decomposition of the polymer film is 1000° C. The ending temperature of thermal decomposition of the polymer film was measured as defined above.

<Preferred Range of Temperatures of the Two or More Heating Spaces>

A preferred range of temperatures of the two or more heating spaces is not lower than 500° C. to lower than 1000° C., preferably not lower than 500° C. to not higher than 900° C., more preferably not lower than 550° C. to not higher than 850° C., even more preferably not lower than 550° C. to not higher than 800° C., or especially preferably not lower than 550° C. to not higher than 700° C. By heat-treating the polymer film at two or more stages in the temperature range of not lower than 500° C. to lower than 1000° C., within which the polymer film easily shrinks through thermal decomposition, the wrinkling and/or cracking can be reduced. Further, the heat treatment of the polymer at two or more stages makes it easy for the resulting graphite film to have a high thermal diffusivity after graphitization.

<Difference in Temperature between Heating Spaces>

The wrinkling and/or cracking can be further reduced by arranging the heat-treating such that, in the temperature range of not lower than 500° C. to lower than 1000° C., within which the polymer film greatly shrinks, of the heat-treating is multi-staged into more stages, thereby reducing, as much as possible, a difference in temperature between each heating space and the next heating space that follows that heating space (difference in temperature between each stage and the previous stage) (such heating spaces being hereinafter referred to as "adjacent heating spaces"). The difference in temperature between the adjacent heating spaces may be not lower than 5° C. and not higher than 200° C., preferably not lower than 10° C. and not higher than 100° C., or more preferably not lower than 20° C. and not higher than 50° C. A temperature difference of not lower than 5° C. inhibits the film from breaking or stretching during the heat treatment, and is preferable because it allows a reduction in the number of heating spaces. Further, a temperature difference of not higher than 200° C. hinders the wrinkling, because it allows a reduction in the amount that the carbonized film shrinks at a time. Furthermore, a temperature difference of not higher than 200° C. makes it easy for the resulting graphite film to have a high thermal diffusivity after graphitization.

In a temperature range of not lower than 600° C. to not higher than 700° C. within which the amount that the polymer film shrinks is especially large, the difference in temperature between each heating space and the next heating space may be not lower than 5° C. and not higher than 50° C., preferably not lower than 10° C. and not higher than 40° C., or more preferably not lower than 15° C. and not higher than 30° C.

It should be noted that the term "difference in temperature between adjacent heating spaces" means a difference between the maximum temperature of the film in either one of the adjacent heating spaces and the maximum temperature of the film in the other one of the adjacent heating spaces, regardless of whether or not a cooling space is provided between these two heating spaces.

<Rate of Decrease in Weight Between Before and after Passing Through Each Heating Space>

The number of heating spaces and the setting of temperatures of the heating spaces may be determined so that a rate of decrease in weight of the film is not higher than 25%, preferably not higher than 20%, or more preferably not higher than 15%, where the rate of decrease in weight of the film is calculated from the weight of the film immediately before entrance into a heating space and the weight of the film immediately after exit from the heating space (such a rate of decrease in weight being hereinafter referred to as "rate of decrease in weight between before and after passing through each heating space"). A rate of decrease in weight of not higher than 25% moderates the shrinkage of the film, thus hindering wrinkling from occurring. Further, a rate of decrease in weight of not higher than 25% makes it easy for the resulting graphite film to have a high thermal diffusivity after graphitization.

It should be noted that the term "rate of decrease in weight between before and after passing through each heating space" refers to the percentage of decrease in weight of the film between before and after heat treatment with respect to the initial weight of the polymer film, i.e., the starting material. The rate of decrease in weight between before and after passing through each heating space can be calculated according to the following formula:

Rate of Decrease in Weight(%)=(Weight of Film Immediately before Entrance into a Heating Space−Weight of Film Immediately after Exit from the Heating Space)/Initial Weight of Polymer Film×100).

The initial weight of the polymer film is the weight of the polymer film as measured at 23° C. after the polymer film has been allowed to stand in an atmosphere of constant 23° C. for 24 hours prior to heat treatment. Further, the weight of the film immediately before entrance into a heating space is the weight of the film as measured at 23° C. after the film, which was taken out immediately before entrance into the heating space, has been allowed to stand in an atmosphere of constant 23° C. for 24 hours. The weight of the film immediately after exit from the heating space is the weight of the film as measured at 23° C. after the film, which was taken out immediately after exit from the heating space, has been allowed to stand in an atmosphere of constant 23° C. for 24 hours.

Further, the rate of retention of the weight of the polymer film after passing through a predetermined heating space refers to the percentage of retention of the weight of the film before and after heat treatment with respect to the initial weight of the polymer film, i.e., the starting material. The rate of retention of the weight of the polymer film before and after passing through a predetermined heating space can be calculated according to the following formula:

Rate of Retention of Weight(%)=(1−(Initial Weight of Polymer Film−Weight of Polymer Film Immediately after Exit from a Predetermined Heating Space)/(Initial Weight of Polymer Film)×100).

<Graphite Film>

A graphite film can be produced by heat-treating a polymer film serving as a raw material film. A possible example of a polymer film suitable for production of a graphite film is at least one type of polymer film selected from the group consisting of a polyimide film, a polyamide film, a polyoxadiazole film, a polybenzothiazole film, a polybenzobisazole film, a polybenzooxazole film, a polybenzobisoxazole film, a poly(paraphenylene vinylene) film, a polybenzoimidazole film, a polybenzobisimidazole film, and a polythiazole film.

Among those named above, the polyimide film is an especially favorable polymer film, because the polyimide film is more likely to develop a layer structure of graphite through carbonization and graphitization than any other polymer film that is made from an organic material.

<Batch-Wise Method for Producing Graphite Films>

An example of a method for producing a graphite film from a polymer film is a method including a carbonization step, a graphitization step, and a pressurization step. In the carbonization step, a film serving as a starting material is carbonized by heat-treating the film either under reduced pressure or in an inert gas. That is, in the carbonization step, the target object to be heat-treated is a carbonized film (i.e., in the carbonization step, a carbonized film is heat-treated).

In this carbonization step, batch-wise heat treatment is carried out usually at a temperature of about 1000° C. For example, in the case of preliminary heat treatment carried out at a rate of temperature rise of 10° C./min from room temperature, it is desirable that heat treatment be carried out with the temperature kept in a temperature range of 1000° C. for about 30 minutes. At the stage of heat treatment, pressure may be applied to the film in a direction parallel to a surface of the film so that the film does not lose its orientation.

It should be noted that the term "carbonized film" in the present invention encompasses a polymer film whose weight has started to decrease (or whose weight has decreased) due to heating.

The graphitization step, which follows the carbonization step, is carried out with the carbonized film set in an ultrahigh-temperature furnace. That is, in the graphitization step, the carbonized film serves as a target object to be heat-treated (i.e., in the graphitization step, the carbonized film is heat-treated).

The graphitization step is carried out either under reduced pressure or in an inert gas. It is most appropriate to use argon as the inert gas, and it is more preferable that a small amount of helium be added to argon. In the graphitization step, heat treatment is carried out preferably at a temperature of not lower than 2400° C., more preferably at a temperature of not lower than 2600° C., even more preferably at a temperature of not lower than 2800° C., or especially preferably at a temperature of not lower than 2900° C. It should be noted that the graphitization step may be carried out in succession to the carbonization step, or may alternatively be carried out after cooling after the carbonization step.

A graphite film obtained through the carbonization step and the graphitization step is in a foamed state in which the graphite layer has been uplifted by the generation of internal gases, such as $N_2$ and a filler (phosphoric acid filler), which do not form a graphite skeleton. In the case of a graphite film that is in a foamed state after the graphitization step, the flexibility can be improved by carrying out the pressurization step, such as compression treatment or rolling treatment, after the graphitization step.

<Graphite Film Production Method Including a Continuous Carbonization Step>

Figure 2:
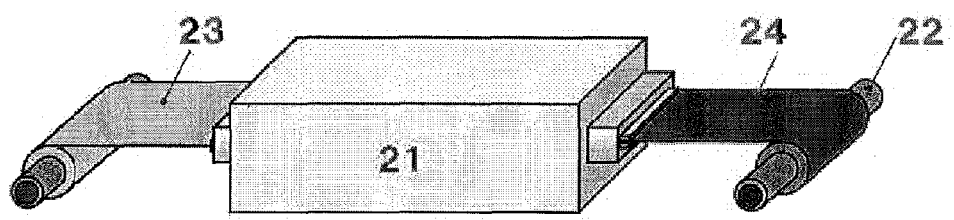
FIG. 2 is a schematic view showing a continuous carbonization step of the present invention.

The method of the present invention for producing a graphite film includes a continuous carbonization step. The continuous carbonization step is a step of, in the carbonization step, continuously baking a long polymer film 23 while continuously feeding it to a heat treatment apparatus 21 as shown in FIG. 2 (such a step being hereinafter also referred to as "continuous heating process"). In this step, the polymer film may be conveyed with winding apparatuses placed both upstream and downstream of the heat treatment apparatus. Further, it is preferable that the continuous carbonization step be carried out in an inert gas such as nitrogen or argon.

The continuous carbonization step may be executed in a temperature range of not lower than 400° C. to not higher than 1800° C., preferably not lower than 450° C. to not higher than 1400° C., more preferably not lower than 500° C. to not higher than 1000° C., even more preferably not lower than 500° C. to not higher than 900° C., much more preferably not lower than 550° C. to not higher than 850° C., still more preferably not lower than 550° C. to not higher than 800° C., or especially preferably not lower than 550° C. to not higher than 700° C. The polymer film can be carbonized by heat-treating it at a temperature not lower than 400° C. Further, the film is given a sufficient strength when heat-treated at a temperature not higher than 1800° C. This makes the film difficult to break during continuous processing. In particular, a more preferred temperature is not higher than 800° C., because at this temperature carbonization does not completely progress and therefore the film becomes difficult to break.

The graphitization step may be carried out by using the continuous heating process in succession to the continuous carbonization step, or may be carried out by using a batch-wise ultrahigh-temperature furnace after the continuous carbonization step.

<Heating Space>

Figure 3:
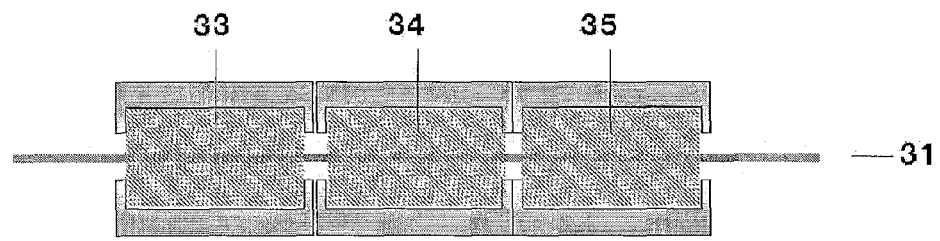
FIG. 3 is a cross-sectional view showing heating spaces.
Figure 3:
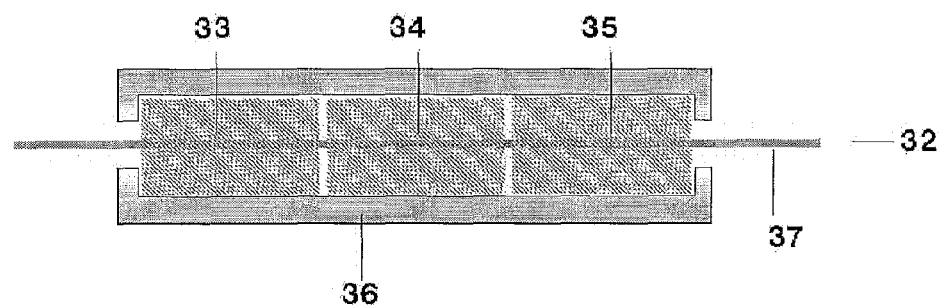
Figure 7:
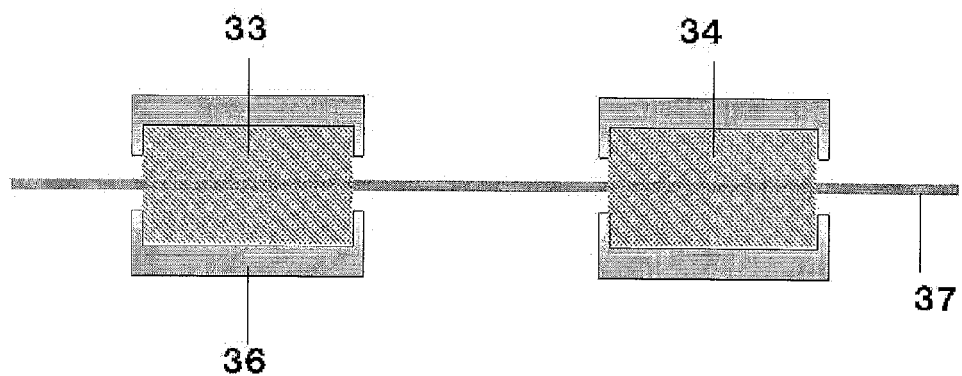
FIG. 7 is a schematic view showing an example of a case where a plurality of heat treatment apparatuses are placed at a distance from each other.

A heating space of the present invention is a space provided in such a heat treatment apparatus 21 as that shown in FIG. 2 for heat treatment of a polymer film. In a case where a plurality of heating spaces are provided, the heating spaces may be physically separated from each other (as shown in FIG. 7, for example), or may be provided in one space as in the case of heating spaces 33, 34, and 35 shown in FIG. 3. In order for the polymer film to be uniformly heated, it is preferable that a temperature distribution in each heating space be kept uniform. However, in order to avoid an abrupt change in temperature, it is possible to provide a gentle temperature gradient over an area extending from an entrance of the heating space to a central part of the heating space and a gentle temperature gradient over an area extending from the central part to an exit of the heating space. The temperature distribution in the heat treatment apparatus can be controlled by devising an arrangement of heaters and/or insulating materials. It should be noted that the term "temperature of a heating space" means a highest actual temperature that the film takes on during passage through the heating space.

There are provided two or more heating spaces, thereby being multi-staged to provide temperatures set at two or more different levels. An upper limit to the number of stages is not particularly limited, but can for example be not more than 100, or rather not more than 50. It is preferable that each stage of heating space be higher in temperature than the previous stage of heating space. For example, it is preferable that the heating space 2 be higher in temperature than the heating space 1 and the heating space 3 be higher in temperature than the heating space 2.

In the present invention, each heating space has a length of not less than 5 cm, preferably not less than 10 cm, or more preferably not less than 20 cm. A heating space having a length of not less than 5 cm makes it possible to impart a sufficient thermal history to a film continuously passing therethrough.

<Cooling Space>

Figure 4:
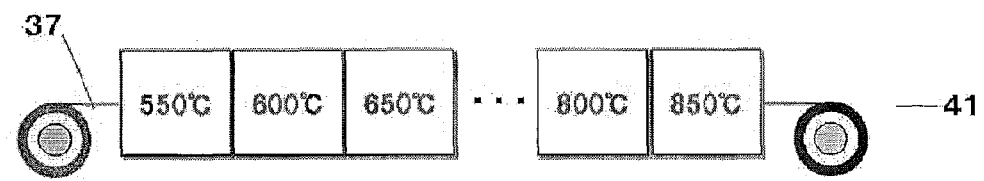
FIG. 4 is a schematic view showing cooling spaces.
Figure 4:
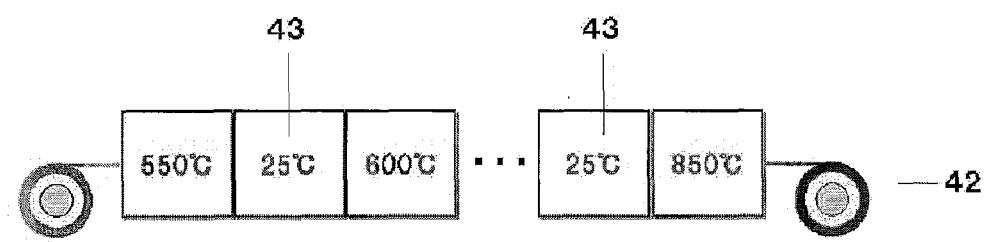

It is preferable that in continuous carbonization step of the present invention, a cooling space be provided between two heating spaces (between one heating space and another) as shown in FIG. 4. The cooling space is a space in which to cool a film heated in a heating space, and is preferably set at a temperature lower than the glass-transition temperature of the polymer film being used. Since the carbonized film gets harder when cooled in the cooling space than when heated in a heating space, the carbonized film is hardly deformable in the cooling space. Providing such a cooling space between a heating space and the next heating space makes wrinkling in the carbonized film more difficult. The larger the number of cooling spaces is, the more remarkable an effect of reducing wrinkling. For this reason, it is preferable that such a cooling space be provided between each heating space and another.

The carbonized film thus obtained through the continuous carbonization step in which a cooling space is provided makes a high-thermal-diffusivity graphite film. It is deduced that this is because the provision of the cooling space makes it possible to carry out the heat treatment in the heating space after the cooling space, while the molecular orientation of the carbonized film in the cooling space is being kept during the heat treatment.

The temperature of a cooling space of the present invention is lower than the temperature of the immediately preceding heating space, and is not higher than 550° C., preferably not higher than 500° C., more preferably not higher than 450° C., even more preferably not higher than 300° C., or especially preferably not higher than 100° C.

It should be noted that the term "temperature of a cooling space" means the a lowest actual temperature that the film takes on during passage through the cooling space.

A cooling space of the present invention has a length of not less than 5 cm, preferably not less than 10 cm, or more preferably not less than 20 cm. With a cooling space having a length of not less than 5 cm, a film continuously passing through the cooling space can be cooled to the temperature of the cooling space.

It should be noted that the term "cooling space" of the present invention encompasses a space between heat treatment apparatuses placed at a distance from each other as shown in FIG. 7. In a case where a film obtained by heat-treating a polymer film in such a heat treatment apparatus 21 as that shown in FIG. 2 and winding the polymer film thus heat-treated is heat-treated again by the heat treatment apparatus (at the same temperature that the polymer film was heat-treated last time or at a different temperature), the term "cooling space" of the present invention encompasses an interval between a point in time at which the film exited the heating space and a point in time at which the film enters the heating space next time.

<Birefringence>

In the present invention, there is no particular limit to the birefringence of a polymer film. However, a birefringence of not less than 0.08 facilitates the progress of carbonization and graphitization of the film, thus making it easier to obtain a graphite film having its graphite layer developed. A high birefringence is preferred especially in such a case as in the present invention where the continuous carbonization step, in which the orientation of the polymer film is easily disrupted, is executed. The birefringence of the polymer film is preferably not less than 0.08, more preferably not less than 0.10, even more preferably not less than 0.12, or especially preferably not less than 0.14. It should be noted that the term "birefringence" means a difference between a refractive index of the film in any direction in a plane of the film and a refractive index of the film in its thickness direction, and can be rephrased as "double refractive index". Although there is no particular upper limit to the birefringence, an upper limit to the birefringence can be not more than 0.20, or rather not more than 0.18.

<Apparatus for Controlling Tension>

In the continuous carbonization step of the present invention, the polymer film may be heat-treated with tension applied to the polymer film by using tension adjustment apparatuses so mounted, for example, upstream and downstream of a heat treatment apparatus as to adjust the tension of the polymer film. Such tension adjustment apparatuses may be provided for all heat treatment apparatuses, or may only be provided for some of the heat treatment apparatuses. Such an adjustment apparatus for adjusting tension is achieved, for example, through a method of applying torque to a rotating shaft of such a winding apparatus as those shown in FIG. 2.

In a case where tension is applied to the polymer film in the continuous carbonization step of the present invention, the tensile strength that is applied to the polymer film may be not less than 5 kgf/cm$^2$ and not more than 500 kgf/cm$^2$, preferably not less than 10 kgf/cm$^2$ and not more than 300 kgf/cm$^2$, or even more preferably not less than 20 kgf/cm$^2$ and not more than 100 kgf/cm$^2$. With a tensile strength of not less than 5 kgf/cm$^2$, the wrinkling in the film due to the shrinkage of the film through thermal decomposition can be reduced. Further, with a tensile strength of not more than 500 kgf/cm$^2$, the film can be prevented from breaking under excessive tension.

<Load that is Applied to the Film in its Thickness Direction>

Figure 5:
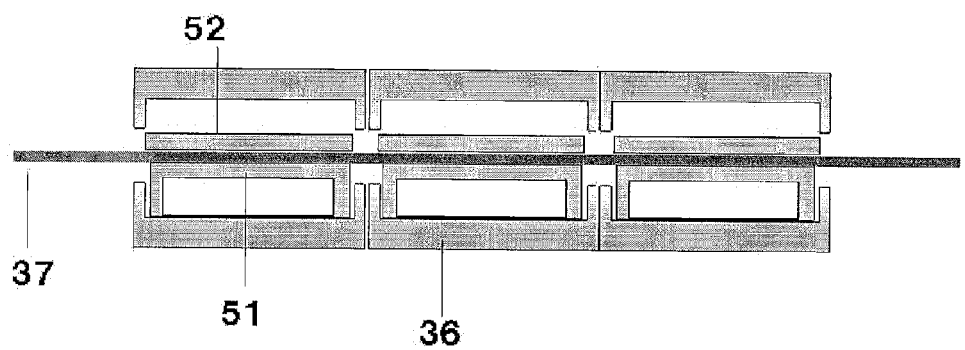
FIG. 5 is a schematic view showing an example of a method for applying a load to the carbonized film in its thickness direction during the continuous carbonization step.

It is preferable that in the continuous carbonization step of the present invention, a load be applied to the film in its thickness direction. An example of a method for applying a load encompasses, but is not particularly limited to, a method in which as shown in FIG. 5, a polymer film 37 moves along a hearth 51 with a weight 52 placed on the polymer film 37. A lower limit to the load that is applied to the film in its thickness direction is not less than 0.1 g/cm$^2$, preferably not less than 0.5 g/cm$^2$, or more preferably 1 g/cm$^2$. An upper limit to the load that is applied to the film in its thickness direction is not more than 50 g/cm$^2$, preferably not more than 20 g/cm$^2$, or more preferably 10 g/cm$^2$. With a load of not less than 0.1 g/cm$^2$, the wrinkling in the film due to the shrinkage of the film through thermal decomposition. Further, with a load of not more than 50 g/cm$^2$, the film can be prevented from breaking under excessive tension.

<Line Speed>

A "line speed" of the film in the continuous carbonization step of the present invention (hereinafter referred to as "line speed") means the speed at which the film is wound after heat treatment. The line speed is not lower than 10 cm/min and not higher than 500 cm/min, preferably not lower than 20 cm/min and not higher than 300 cm/min, or preferably not lower than 30 cm/min and not higher than 150 cm/min. A line speed of not lower than 10 cm/min is preferred in terms of productivity. Further, a line speed of not higher than 500 cm/min makes uniform heat treatment possible in each heating space, thus hindering defects such as wrinkling from occurring.

It should be noted that a method of the present invention for producing a graphite film is expressed as recited in (1) below and the present invention also encompasses the aspects (2) to (7).

(1) A method for producing a graphite film, including a continuous carbonization step that includes two or more heating spaces.

(2) The method as set forth in (1), wherein each of the heating spaces has a temperature that falls within a range of not lower than a starting temperature of thermal decomposition of a polymer film to lower than an ending temperature of thermal decomposition of the polymer film.

(3) The method as set forth in (1) or (2), wherein in the continuous carbonization step, each of at least two or more of the heating spaces has a temperature that falls within a range of not lower than 500° C. to lower than 1000° C.

(4) The method as set forth in any one of (1) to (3), wherein in the continuous carbonization step, at least one cooling space is provided.

(5) The method as set forth in any one of (1) to (4), wherein a difference in temperature between adjacent ones of the heating spaces falls within a range of not lower than 5° C. to not higher than 200° C.

(6) The method as set forth in any one of (1) to (5), wherein a rate of decrease in weight of a film between before and after passing through each of the heating spaces is not higher than 25%.

(7) The method as set forth in any one of (1) to (6), wherein a polymer film to be subjected to the continuous carbonization step has a birefringence of not less than 0.10.

Further, a method of the present invention for producing a carbonized film is expressed as recited in (8) below and the present invention also encompasses the aspects (9) to (14).

(8) A method for producing a carbonized film, including a continuous carbonization step that includes two or more heating spaces.

(9) The method as set forth in (8), wherein each of the heating spaces has a temperature that falls within a range of not lower than a starting temperature of thermal decomposition of a polymer film to lower than an ending temperature of thermal decomposition of the polymer film.

(10) The method as set forth in (8) or (9), wherein in the continuous carbonization step, each of at least two or more of the heating spaces has a temperature that falls within a range of not lower than 500° C. to lower than 1000° C.

(11) The method as set forth in any one of (8) to (10), wherein in the continuous carbonization step, at least one cooling space is provided.

(12) The method as set forth in any one of (8) to (11), wherein a difference in temperature between adjacent ones of the heating spaces falls within a range of not lower than 5° C. to not higher than 200° C.

(13) The method as set forth in any one of (8) to (12), wherein a rate of decrease in weight of a film between before and after passing through each of the heating spaces is not higher than 25%.

(14) The method as set forth in any one of (8) to (13), wherein a polymer film to be subjected to the continuous carbonization step has a birefringence of not less than 0.10.

EXAMPLES

In the following, various examples of the present invention are explained together with some comparative examples.

<Conditions for Measurement of Various Properties>

<Wrinkling after the Continuous Carbonization Step (Winding Test)>

Wrinkling in carbonized films after the continuous carbonization step was evaluated. The evaluation of wrinkling was carried out by confirming whether or not the carbonized films cracked when wound around paper cores of varying diameters five times in an atmosphere of 23° C. Those carbonized films with more wrinkles in them easily crack when wound around paper cores, and as such, cannot be wound around paper cores of small diameters.

Evaluations were made according to the following criteria: A (for those carbonized films which did not crack even when wound around paper cores of a diameter of 2 inches); B (for those carbonized films which cracked when wound around paper cores of a diameter of 2 inches but did not crack when wound around paper cores of a diameter of 3 inches); C (for those carbonized films which cracked when wound around paper cores of a diameter of 3 inches but did not crack when wound around paper cores of a diameter of 4 inches); D (for those carbonized films which cracked when wound around paper cores of a diameter of 4 inches but did not crack when wound around paper cores of a diameter of 5 inches); and E (for those carbonized films which cracked even when wound around paper cores of a diameter of 5 inches).

<Thermal Diffusivities of the Graphite Films>

A thermal diffusivity of each graphite film in a direction parallel to a surface of the graphite film was obtained by measuring a thermal diffusivity of a sample of the graphite film at 10 Hz in an atmosphere of 23° C. with use of an AC method thermal diffusivity measuring apparatus ("LaserPit" manufactured by ULVAC-RIKO, Inc.), where the sample was prepared by cutting a 4×40 mm sample out of the graphite film.

<Birefringence>

A birefringence of each polymer film was measured by using a Metricon's refractive index and film thickness measuring system (Model: 2010 PRISM COUPLER). The measurement was carried out by measuring refractive indices of the polymer film in TE and TM modes, respectively, with use of a light source at a wavelength of 594 nm in an atmosphere of 23° C. and obtaining the value of TE−TM as the birefringence.

<Temperatures of Heating Spaces and Cooling Spaces>

A temperature of each heating space or cooling space was measured by, with use of a sheathed K thermocouple having a diameter of 0.5 mm (manufactured by Yamari Industries, Limited), measuring an actual temperature of the film passing through the heating space or cooling space with the thermocouple in contact with the film. The term "temperature of a heating space" means the highest temperature that the film takes on during passage through the heating space, and the term "temperature of a cooling space" means the lowest temperature that the film takes on during passage through the cooling space.

Example 1

As indicated by the reference sign 41 in FIG. 4, the continuous carbonization step was executed by setting a roll of Kaneka's polyimide film Apical NPI having a birefringence of 0.14, a thickness of 75 μm, a width of 200 mm, and a length of 50 m on a winding apparatus and continuously feeding the film through a heat treatment apparatus. The lengths of each heating space along its MD direction (machine direction) and its TD direction (transverse direction) were 50 cm and 300 mm, respectively. The heating spaces were set at 550° C., 600° C., 650° C., 700° C., 750° C., 800° C., and 850° C., respectively, in such a manner that the temperature inside of each of the heating spaces was uniform. The film was conveyed at a line speed of 50 cm/min with a tensile strength of 30 kgf/cm² applied to the film. In each heating space, the film was conveyed through a space between upper and lower graphite jigs placed above and below the film, respectively, as shown in FIG. 5. A pressure of 2 g/cm² was applied to the film in its thickness direction. Wrinkling in the carbonized film thus obtained was evaluated. The results are shown in Tables 1 and 2.

Figure 6:
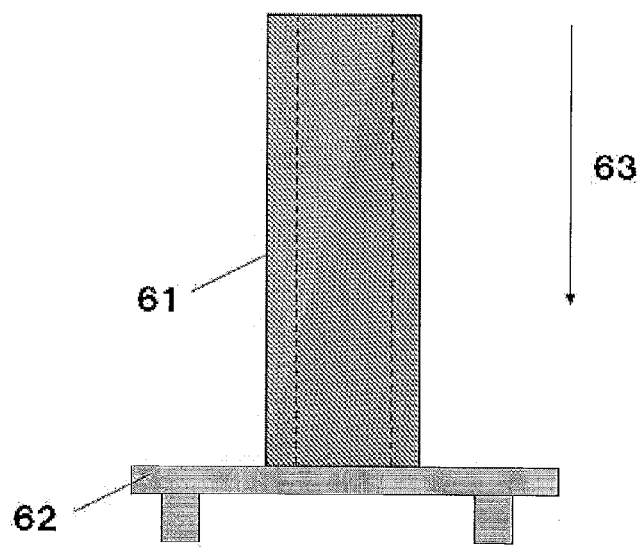
FIG. 6 is a schematic view showing a method of setting for graphitization in Examples and Comparative Examples.

Next, the carbonized film was wound into a roll, put into a graphitization furnace in such a manner that the TD direction of the carbonized film coincides with a vertical direction as shown in FIG. 6, and heat-treated by heating it to 2900° C. at a rate of temperature rise of 2° C./min.

The film thus obtained was compressed under a pressure of 10 MPa, and the thermal diffusivity and flexibility of the graphite film thus obtained were evaluated. The results are shown in Tables 1 and 2.

Example 2

A graphite film was produced in the same manner as that described in Example 1, except that a cooling space which had a length of 50 cm along its MD direction and which had its temperature set at 25° C. was provided between each of the heating spaces and another as indicated by the reference sign 42 in FIG. 4. The various properties of the graphite film were evaluated. The results are shown in Tables 1 and 2.

Example 3

A graphite film was produced in the same manner as that described in Example 2, except that the cooling spaces had their temperatures set at 450° C. The various properties of the graphite film were evaluated. The results are shown in Tables 1 and 2.

Example 4

A graphite film was produced in the same manner as that described in Example 1, except that the first three zones of Example 2 were replaced by a heating space at 550° C., a heating space at 550° C., and a heating space at 600° C., respectively, and a cooling space which had a length of 50 cm along its MD direction and which had its temperature set at 550° C. was provided between each of the third and subsequent heating spaces and the next heating space. The various properties of the graphite film were evaluated. The results are shown in Tables 1 and 2.

Example 5

A graphite film was produced in the same manner as that described in Example 2, except that the heating spaces had their temperatures set at 550° C., 650° C., 750° C., and 850° C., respectively. The various properties of the graphite film were evaluated. The results are shown in Tables 1 and 2.

Example 6

A graphite film was produced in the same manner as that described in Example 5, except that a heating space at 600° C. was provided between the heating space at 550° C. and the heating space at 650° C. The various properties of the graphite film were evaluated. The results are shown in Tables 1 and 2.

Example 7

A graphite film was produced in the same manner as that described in Example 5, except that a heating space at 700° C. was provided between the heating space at 650° C. and the heating space at 750° C. The various properties of the graphite film were evaluated. The results are shown in Tables 1 and 2.

Example 8

A graphite film was produced in the same manner as that described in Example 2, except that a heating space at 575° C. was provided between the heating space at 550° C. and the heating space at 600° C. The various properties of the graphite film were evaluated. The results are shown in Tables 1 and 2.

Example 9

A graphite film was produced in the same manner as that described in Example 2, except that a heating space at 625° C. was provided between the heating space at 600° C. and the heating space at 650° C. The various properties of the graphite film were evaluated. The results are shown in Tables 1 and 2.

Example 10

A graphite film was produced in the same manner as that described in Example 2, except that a heating space at 675° C. was provided between the heating space at 650° C. and the heating space at 700° C. The various properties of the graphite film were evaluated. The results are shown in Tables 1 and 2.

Example 11

A graphite film was produced in the same manner as that described in Example 9, except that no pressure was applied to the film in its thickness direction. The various properties of the graphite film were evaluated. The results are shown in Tables 1 and 2.

Example 12

A graphite film was produced in the same manner as that described in Example 2, except that the polymer film used had a thickness of 50 μm instead. The various properties of the graphite film were evaluated. The results are shown in Tables 1 and 2.

Example 13

A graphite film was produced in the same manner as that described in Example 2, except that the polymer film used had a thickness of 125 μm instead. The various properties of the graphite film were evaluated. The results are shown in Tables 1 and 2.

Example 14

A graphite film was produced in the same manner as that described in Example 2, except that a Kaneka's polymer film Apical NPI having a low birefringence (i.e., a birefringence of 0.10) was used. The results are shown in Tables 3 and 4.

Examples 15 and 16

In Example 15, a graphite film was produced in the same manner as that described in Example 2, except that the polymer film used was a POD (polyparaphenylene oxadiazole) film. In Example 16, a graphite film was produced in the same manner as that described in Example 2, except that the polymer film used was a PPV (poly(paraphenylene vinylene)) film. The results are shown in Tables 3 and 4.

Examples 17 and 18

In Example 17, a graphite film was produced in the same manner as that described in Example 2, except that the polymer film used had a width of 50 mm instead. In Example 18, a graphite film was produced in the same manner as that described in Example 2, except that the polymer film used had a width of 300 mm instead. The results are shown in Tables 3 and 4.

Example 19

A graphite film was produced in the same manner as that described in Example 5, except that Zones 1 to 5 were a heating space at 550° C., a cooling space at 25° C., a heating space at 750° C., a cooling space at 25° C., and a heating space at 850° C., respectively. The results are shown in Tables 3 and 4.

Example 20

A graphite film was produced in the same manner as that described in Example 5, except that the heating space of Zone 7 had its temperature changed from 750° C. to 700° C. and the continuous carbonization step was finished at Zone 7 (Zones 8 and 9 were not used). The results are shown in Tables 3 and 4.

Example 21

A graphite film was produced in the same manner as that described in Example 10, except that the heating spaces of Zones 7, 9, 11, 13, and 15 had their temperatures changed from 675° C. to 700° C., from 700° C. to 750° C., from 750° C. to 800° C., from 800° C. to 850° C., and from 850° C. to 1000° C., respectively. The results are shown in Tables 3 and 4.

Comparative Example 1

A graphite film was produced in the same manner as that described in Example 1, except that only a single heating space at 850° C. was provided. The various properties of the graphite film were evaluated. The results are shown in Tables 3 and 4.

Comparative Examples 2 and 3

In Comparative Example 2, a graphite film was produced in the same manner as that described in Comparative Example 1, except that the heating space of Zone 1 had its temperature changed from 850° C. to 1000° C. In Comparative Example 3, a graphite film was produced in the same manner as that described in Comparative Example 1, except that the heating space of Zone 1 had its temperature changed from 850° C. to 800° C. The results are shown in Tables 3 and 4.

Reference Example 1

Example 1 of Japanese Patent Application Publication, Tokukaihei, No. 4-149013 A was replicated.

A graphite film was produced in the same manner as that described in Example 1, except that a DuPont's polyimide film Kapton H having a thickness of 50 μm, a width of 50 mm, and a length of 50 m was used, that the temperature was set at 1000° C., that a tensile strength of 2 kgf/cm$^2$ was applied to the film, that the film was conveyed at a line speed of 1.25 cm/min so as to be heated to 1000° C. at a rate of temperature rise of 25° C./min, that the heating space had no hearth inside, and that no load was applied. The various properties of the graphite film were evaluated. The results are shown in Tables 3 and 4.

Reference Example 2

Example 2 of Japanese Patent Application Publication, Tokukai, No. 2004-299937 A was replicated.

A graphite film was produced in the same manner as that described in Example 1, except that a Kaneka's polyimide film Apical AH having a thickness of 50 μm, a width of 50 mm, and a length of 5 m was used, that the temperature was set at 800° C., that a tensile strength of not more than 0.1 kgf/cm$^2$ was applied to the film, that the film was conveyed at a line speed of 1.66 cm/min, and that no load was applied in the space. The various properties of the graphite film were evaluated. The results are shown in Tables 3 and 4.

TABLE 1

| | Raw material film | | | | Continuous carbonization step Temperature in each zone (Rate of retention of weight with respect to raw material film) | | | | |
|---|---|---|---|---|---|---|---|---|---|
| | Type | Birefringence | Thickness μm | Width mm | 1 | 2 | 3 | 4 | 5 |
| Example 1 | Apical NPI | 0.14 | 75 | 200 | 550 (97%) | 600 (89%) | 650 (73%) | 700 (69%) | 750 (65%) |
| Example 2 | Apical NPI | 0.14 | 75 | 200 | 550 (97%) | 25 | 600 (89%) | 25 | 650 (73%) |
| Example 3 | Apical NPI | 0.14 | 75 | 200 | 550 (97%) | 450 | 600 (89%) | 450 | 650 (73%) |
| Example 4 | Apical NPI | 0.14 | 75 | 200 | 550 (97%) | 550 (96%) | 600 (89%) | 550 | 650 (73%) |
| Example 5 | Apical NPI | 0.14 | 75 | 200 | 550 (97%) | 25 | 650 (73%) | 25 | 750 (65%) |
| Example 6 | Apical NPI | 0.14 | 75 | 200 | 550 (97%) | 25 | 600 (89%) | 25 | 650 (73%) |
| Example 7 | Apical NPI | 0.14 | 75 | 200 | 550 (97%) | 25 | 650 (73%) | 25 | 700 (69%) |
| Example 8 | Apical NPI | 0.14 | 75 | 200 | 550 (97%) | 25 | 575 (95%) | 25 | 600 (89%) |
| Example 9 | Apical NPI | 0.14 | 75 | 200 | 550 (97%) | 25 | 600 (89%) | 25 | 625 (77%) |
| Example 10 | Apical NPI | 0.14 | 75 | 200 | 550 (97%) | 25 | 600 (89%) | 25 | 650 (73%) |
| Example 11 | Apical NPI | 0.14 | 75 | 200 | 550 (97%) | 25 | 600 (89%) | 25 | 625 (77%) |
| Example 12 | Apical NPI | 0.14 | 50 | 200 | 550 (96%) | 25 | 600 (88%) | 25 | 650 (72%) |
| Example 13 | Apical NPI | 0.14 | 125 | 200 | 550 (98%) | 25 | 600 (90%) | 25 | 650 (74%) |

| | Continuous carbonization step Temperature in each zone (Rate of retention of weight with respect to raw material film) | | | | | | | | |
|---|---|---|---|---|---|---|---|---|---|
| | 6 | 7 | 8 | 9 | 10 | 11 | 12 | 13 | 14 | 15 |
| Example 1 | 800 (62%) | 850 (60%) | — | — | — | — | — | — | — | — |
| Example 2 | 25 | 700 (69%) | 25 | 750 (65%) | 25 | 800 (62%) | 25 | 850 (60%) | — | — |
| Example 3 | 450 | 700 (69%) | 450 | 750 (65%) | 450 | 800 (62%) | 450 | 850 (60%) | — | — |
| Example 4 | 550 | 700 (69%) | 550 | 750 (65%) | 550 | 800 (62%) | 550 | 850 (60%) | — | — |
| Example 5 | 25 | 850 (60%) | — | — | — | — | — | — | — | — |
| Example 6 | 25 | 750 (65%) | 25 | 850 (60%) | — | — | — | — | — | — |
| Example 7 | 25 | 750 (65%) | 25 | 850 (60%) | — | — | — | — | — | — |
| Example 8 | 25 | 650 (73%) | 25 | 700 (69%) | 25 | 750 (65%) | 25 | 800 (62%) | 25 | 850 (60%) |
| Example 9 | 25 | 650 (73%) | 25 | 700 (69%) | 25 | 750 (65%) | 25 | 800 (62%) | 25 | 850 (60%) |
| Example 10 | 25 | 675 (71%) | 25 | 700 (69%) | 25 | 750 (65%) | 25 | 800 (62%) | 25 | 850 (60%) |
| Example 11 | 25 | 650 (73%) | 25 | 700 (69%) | 25 | 750 (65%) | 25 | 800 (62%) | 25 | 850 (60%) |
| Example 12 | 25 | 700 (68%) | 25 | 750 (64%) | 25 | 800 (61%) | 25 | 850 (59%) | — | — |
| Example 13 | 25 | 700 (70%) | 25 | 750 (66%) | 25 | 800 (63%) | 25 | 850 (61%) | — | — |

TABLE 2

| | Continuous carbonization step | | | | | | | Graphitization step | | Thermal diffusivity of graphite film |
|---|---|---|---|---|---|---|---|---|---|---|
| | Maximum rate of weight decrease between before and after passing through each heating space | Tensile strength | Line speed | Hearth | Load | | Wrinkles (winding test) | Max. temp. | Rate of temp. rise | |
| | % | kgf/cm² | cm/min | Provided? | Applied? | g/cm² | | ° C. | ° C./min | cm²/s |
| Example 1 | 16 | 30 | 50 | Yes | Yes | 2 | D | 2900 | 2 | 6.8 |
| Example 2 | 16 | 30 | 50 | Yes | Yes | 2 | B | 2900 | 2 | 7.8 |
| Example 3 | 16 | 30 | 50 | Yes | Yes | 2 | B | 2900 | 2 | 7.7 |
| Example 4 | 16 | 30 | 50 | Yes | Yes | 2 | C | 2900 | 2 | 7.5 |
| Example 5 | 24 | 30 | 50 | Yes | Yes | 2 | C | 2900 | 2 | 7.2 |
| Example 6 | 16 | 30 | 50 | Yes | Yes | 2 | B | 2900 | 2 | 7.6 |
| Example 7 | 24 | 30 | 50 | Yes | Yes | 2 | C | 2900 | 2 | 7.3 |
| Example 8 | 16 | 30 | 50 | Yes | Yes | 2 | B | 2900 | 2 | 7.9 |
| Example 9 | 11 | 30 | 50 | Yes | Yes | 2 | A | 2900 | 2 | 8.2 |
| Example 10 | 16 | 30 | 50 | Yes | Yes | 2 | B | 2900 | 2 | 7.9 |
| Example 11 | 11 | 30 | 50 | Yes | No | 0 | B | 2900 | 2 | 8.2 |
| Example 12 | 16 | 30 | 50 | Yes | Yes | 2 | B | 2900 | 2 | 8.0 |
| Example 13 | 16 | 30 | 50 | Yes | Yes | 2 | B | 2900 | 2 | 7.2 |

TABLE 3

| | Raw material film | | | | Continuous carbonization step Temperature in each zone (Rate of retention of weight with respect to raw material film) | | | | |
|---|---|---|---|---|---|---|---|---|---|
| | | | Thickness | Width | | | | | |
| | Type | Birefringence | μm | mm | 1 | 2 | 3 | 4 | 5 |
| Example 14 | Apical AH | 0.10 | 75 | 200 | 550 (96%) | 25 | 600 (88%) | 25 | 650 (72%) |
| Example 15 | POD (polyparaphenylene oxadiazole) | 0.09 | 75 | 200 | 550 (94%) | 25 | 600 (86%) | 25 | 650 (70%) |
| Example 16 | PPV (polyparaphenylene vinylene) | 0.09 | 75 | 200 | 550 (98%) | 25 | 600 (90%) | 25 | 650 (74%) |
| Example 17 | ApicalNPI | 0.14 | 75 | 50 | 550 (97%) | 25 | 600 (89%) | 25 | 650 (73%) |
| Example 18 | ApicalNPI | 0.14 | 75 | 300 | 550 (97%) | 25 | 600 (89%) | 25 | 650 (73%) |
| Example 19 | ApicalNPI | 0.14 | 75 | 200 | 550 (97%) | 25 | 750 (65%) | 25 | 850 (60%) |
| Example 20 | ApicalNPI | 0.14 | 75 | 200 | 550 (97%) | 25 | 600 (89%) | 25 | 650 (73%) |
| Example 21 | ApicalNPI | 0.14 | 75 | 200 | 550 (97%) | 25 | 600 (89%) | 25 | 650 (73%) |
| Comp. Ex. 1 | Apical NPI | 0.14 | 75 | 200 | 850 (60%) | — | — | — | — |
| Comp. Ex. 2 | Apical NPI | 0.14 | 75 | 200 | 1000 (50%) | — | — | — | — |
| Comp. Ex. 3 | Apical NPI | 0.14 | 75 | 200 | 800 (62%) | — | — | — | — |
| Ref. Ex. 1 DuPont's Patent Literature H4-149013 Example 1 | Kapton H | 0.10 | 50 | 50 | 1000 (50%) | — | — | — | — |
| Ref. Ex. 2 Kaneka's Patent Literature 2004-299937 | Apical AH | 0.10 | 50 | 50 | 800 (62%) | — | — | — | — |

TABLE 3-continued

| | | Continuous carbonization step<br>Temperature in each zone<br>(Rate of retention of weight with respect to raw material film) | | | | | | | | | |
|---|---|---|---|---|---|---|---|---|---|---|---|
| | | 6 | 7 | 8 | 9 | 10 | 11 | 12 | 13 | 14 | 15 |
| | Example 14 | 25 | 700 (68%) | 25 | 750 (64%) | 25 | 800 (61%) | 25 | 850 (59%) | — | — |
| | Example 15 | 25 | 700 (66%) | 25 | 750 (62%) | 25 | 800 (59%) | 25 | 850 (57%) | — | — |
| | Example 16 | 25 | 700 (70%) | 25 | 750 (66%) | 25 | 800 (63%) | 25 | 850 (61%) | — | — |
| | Example 17 | 25 | 700 (69%) | 25 | 750 (65%) | 25 | 800 (62%) | 25 | 850 (60%) | — | — |
| | Example 18 | 25 | 700 (69%) | 25 | 750 (65%) | 25 | 800 (62%) | 25 | 850 (60%) | — | — |
| | Example 19 | — | — | — | — | — | — | — | — | — | — |
| | Example 20 | 25 | 700 (69%) | | | | | | | — | — |
| | Example 21 | 25 | 700 (69%) | 25 | 750 (65%) | 25 | 800 (62%) | 25 | 850 (60%) | 25 | 1000 (60%) |
| | Comp. Ex. 1 | — | — | — | — | — | — | — | — | | |
| | Comp. Ex. 2 | — | — | — | — | — | — | — | — | | |
| | Comp. Ex. 3 | — | — | — | — | — | — | — | — | | |
| | Ref. Ex. 1 DuPont's Patent Literature H4-149013 Example 1 | — | — | — | — | — | — | — | — | | |
| | Ref. Ex. 2 Kaneka's Patent Literature 2004-299937 | — | — | — | — | — | — | — | — | | |

TABLE 4

| | Continuous carbonization step | | | | | | | Graphitization step | | Thermal diffusivity of graphite film |
|---|---|---|---|---|---|---|---|---|---|---|
| | Maximum rate of weight decrease between before and after through each heating space | Tensile strength | Line speed | Hearth | Load | | Wrinkles (winding | Max. temp. | Rate of temp. rise | |
| | % | kgf/cm$^2$ | cm/min | Provided? | Applied? | g/cm$^2$ | test) | °C. | °C./min | cm$^2$/s |
| Example 14 | 16 | 30 | 50 | Yes | Yes | 2 | B | 2900 | 2 | 1.0 |
| Example 15 | 16 | 30 | 50 | Yes | Yes | 2 | B | 2900 | 2 | 3.4 |
| Example 16 | 16 | 30 | 50 | Yes | Yes | 2 | B | 2900 | 2 | 2.8 |
| Example 17 | 16 | 30 | 50 | Yes | Yes | 2 | A | 2900 | 2 | 7.8 |
| Example 18 | 16 | 30 | 50 | Yes | Yes | 2 | C | 2900 | 2 | 7.8 |
| Example 19 | 32 | 30 | 50 | Yes | Yes | 2 | D | 2900 | 2 | 6.5 |
| Example 20 | 16 | 30 | 50 | Yes | Yes | 2 | A | 2900 | 2 | 8.0 |
| Example 21 | 16 | 30 | 50 | Yes | Yes | 2 | C | 2900 | 2 | 7.6 |
| Comp. Ex. 1 | 40 | 30 | 50 | Yes | Yes | 2 | E | 2900 | 2 | 4.2 |
| Comp. Ex. 2 | 50 | 30 | 50 | Yes | Yes | 2 | E | 2900 | 2 | 3.5 |
| Comp. Ex. 3 | 38 | 30 | 50 | Yes | Yes | 2 | E | 2900 | 2 | 4.0 |
| Ref. Ex. 1 DuPont's Patent Literature H4-149013 Example 1 | 50 | 2 | 1.25 | No | No | 0 | F | 2900 | 2 | 1.0 |
| Ref. Ex. 2 Kaneka's Patent Literature 2004-299937 | 38 | 0.1 | 1.66 | Yes | No | 0 | F | 2900 | 2 | 0.8 |

<As to Two or More Heating Spaces>

A comparison between Examples 1 to 10 and Comparative Example 1 is made. The graphite films of Examples 1 to 10, in each of which two or more heating spaces were provided, got fewer wrinkles after the continuous carbonization step than did the graphite film of Example 1, in which only a single heating space was provided, and were able to be wound around paper cores of smaller diameters than was the graphite film of Example 1. This is because the provision of two or more heating spaces reduced the amount that the film shrank at a time through thermal decomposition, thus reducing wrinkling.

Further, in Comparative Examples 2 and 3, in each of which the heating space had its temperature set at 1000° C. or 800° C., the carbonized films were prone to wrinkling, and the resulting graphite films ended up with low thermal diffusivities. In such a case where only a single heating space is provided, no satisfactory graphite film was obtained.

<Cooling Space>

A comparison between Examples 1 and 2 is made. The graphite film of Example 2, in which cooling spaces were provided, got fewer wrinkles than did the graphite film of Example 1, in which no cooling space was provided. This is because the film gets harder when cooled in the cooling space, and therefore becomes hardly deformable.

Further, the graphite film of Example 2 exhibited a higher thermal diffusivity after graphitization than did the graphite film of Example 1. This is estimated to be because the progress of graphitization was facilitated since a molecular chain disrupted due to excessive thermal decomposition was reset in the cooling space.

A comparison among Examples 2 to 4, each of which had its cooling spaces set at a temperature different from the temperature of those of another, is made. The graphite films of Examples 2 and 3, each of which had its cooling spaces set at a temperature not higher than the hardening temperature of the film, got fewer wrinkles than did the graphite film of Example 4, in which the film cannot be hardened. Further, the graphite films of Examples 2 and 3 exhibited higher thermal diffusivities after graphitization than did the graphite film of Example 4.

<Difference in Temperature Between Heating Spaces>

A comparison between Examples 2 and 5, each of which has a specific difference in temperature between a heating space and the next heating space, is made. The graphite film of Example 2, in which the difference in temperature was 50° C., got fewer wrinkles than did the graphite film of Example 5, in which the difference in temperature was 100° C. This is because Example 5 was better able to reduce the amount that the film shrank in each heating space than was Example 2, thus further hindering wrinkling, compared with Example 2.

A comparison among Examples 5 to 7 is made. Since Example 6 set up a temperature interval of 50° C. in the temperature range of not lower than 600° C. to not higher than 700° C., where it is particularly preferable that the difference in temperature between heating spaces be small, the graphite film of Example 6 got fewer wrinkles than did the graphite films of Example 7, which set up a temperature interval of 50° C. in another temperature range. This shows that setting up a small difference in temperature in the temperature range of not lower than 600° C. to not higher than 700° C. is effective.

Further, a comparison among Examples 2 and 8 to 10 is made. The graphite film of Example 9, which set up temperature intervals of 25° C. in the temperature range of 600° C. to 650° C., got extremely few wrinkles. This shows that setting up a small difference in temperature in the temperature range is effective.

<Relationship between the Rate of Decrease in Weight Between Before and after Treatment in Each Heating Space and Wrinkles>

The graphite films of Examples 1 to 10, in which the maximum rates of decrease in weight were not higher than 25%, got fewer wrinkles than did the graphite film of Comparative Example 1, in which the rate of decrease in weight was 40%. A comparison among Examples 2 and 5 to 10, in which a cooling space was provided between each temperature space and another, shows that the graphite film of Example 9, in which the maximum rate of decrease in weight was 11%, got the fewest wrinkles, that the graphite films of Examples 2, 6, 8, and 10, in which the maximum rates of decrease in weight ranged from 16% to 20%, hardly got wrinkles, and that the graphite films of Examples 5 and 7, in which the maximum rates of decrease in weight were both 24%, were prone to wrinkles. These results shows that wrinkling can be reduced by reducing the amount that the film shrinks at a time through thermal decomposition.

<Pressure that is Applied to the Film in its Thickness Direction>

A comparison between Example 9, in which pressure was applied to the film in its thickness direction, and Example 11, in which no such pressure was applied, shows that the graphite film of Example 9 got fewer wrinkles than did the graphite film of Example 11.

<Thicknesses of the Polymer Films>

Example 12, whose polymer film had a thickness of 50 μm, and Example 13, whose polymer film had a thickness of 125 μm, shows that carbonized films with fewer wrinkles can be non-problematically made from polymer films ranging in thickness from 50 μm to 125 μm. Further, a comparison between Examples 12 and 13 shows that a thinner polymer film results in a graphite film with a higher thermal diffusivity.

<Birefringence of the Polymer Films>

A comparison between Examples 2 and 14 shows that a carbonized film with fewer wrinkles can be non-problematically obtained even in a case where a polymer film having a low birefringence is used. However, the graphite film of Example 14, whose polymer film had a low birefringence, ended up with a low thermal diffusivity.

<Types of the Polymer Films>

The results of Examples 15 and 16 show that a carbonized film with fewer wrinkles can be non-problematically obtained even in a case where the polymer film used is a POD film or a PPV film. However, a comparison among Examples 2, 15, and 16 shows that of the graphite films of Examples 2, 15, and 16, the graphite film of Example 2, in which the polymer film used was a polyimide film, exhibited the highest thermal diffusivity.

<Widths of the Polymer Films>

In Examples 17 and 18, which got the grades A and C, respectively, for their wrinkles after the continuous carbonization step (as a results of the winding test), the carbonized films obtained got fewer wrinkles. Further, a comparison between Examples 17 and 18 shows that a narrower polymer film results in a carbonized film with fewer wrinkles. Examples 17 and 18 show that carbonized films can be non-problematically made from polymer films ranging in width from 50 mm to 300 mm.

<Difference in Temperature Between Heating Spaces>

In Example 19, which had a wide difference of 200° C. in heating temperature between Zones 1 and 2, the rate of retention of the weight of the polymer film after passing through the heating space of Zone 1 was 97%, and the rate of decrease in weight of the polymer film was 3%. On the other hand, the rate of retention of the weight of the polymer film after passing through the heating space of Zone 3 was 65%, and the rate of decrease in weight of the polymer film was 32%. The difference in rate of weight decrease between Zones 1 and 3 is 29%, which caused the polymer film to rapidly shrink. Accordingly, Example 19 got the grade D for its wrinkles after the continuous carbonization step (as a result of the winding test). The wrinkling of the carbonized film of Example 19 was not much reduced for a carbonized film of the present invention.

<Highest Temperature Among Those of the Heating Spaces>

A comparison between Examples 5 and 21 shows that the carbonized film of Example 21, whose temperature rise was gentler than that of Example 5 and whose highest temperature among those of the heating spaces was higher than that of Example 5, more hardly got wrinkles in the carbonized film than did Example 5, and got a good grade A for its wrinkles after the continuous carbonization step (as a result of the winding test).

Further, in Example 10, the heating space of Zone 15, which was highest in temperature among the heating spaces, had its temperature set at 850° C., and in Example 21, the heating space of Zone 15, which was highest in temperature among the heating spaces, had its temperature set at 1000° C. Examples 10 and 21 got the grades B and C, respectively, for their wrinkles after the continuous carbonization step (as a result of the winding test). This shows that a carbonized film is obtained with fewer wrinkles when the highest temperature among those of the heating spaces is lower and that a carbonized film is obtained with more wrinkles when the highest temperature among those of the heating spaces is higher. Furthermore, the graphite film of Example 10, whose highest temperature among those of the heating spaces was lower, exhibited a higher thermal diffusivity.

REFERENCE SIGNS LIST

11 Carbonized film after continuous baking
21 Heat treatment apparatus
22 Winding apparatus
23 Polymer film before heat treatment
24 Polymer film after heat treatment
31 Heating spaces physically separated from one another
32 Heating spaces not physically separated from one another
33 Heating space 1
34 Heating space 2
35 Heating space 3
36 Furnace casing
37 Polymer film
41 Case where no cooling space is provided
42 Case where cooling spaces are provided
43 Cooling space
51 Hearth
52 Weight
61 Roll of carbonized film
62 Hearth
63 Direction of gravitational force

The invention claimed is:

1. A method for producing a graphite film, comprising:
a continuous carbonization step that includes subjecting a polymer film to two or more heating spaces each of which has a temperature that falls within a range of not lower than 500° C. to not higher than 900° C., so as to obtain a carbonized film; and
a graphitization step of heating the carbonized film at a temperature of not lower than 2400° C. to obtain a graphite film.

2. The method as set forth in claim 1, wherein each of the heating spaces has a temperature that falls within a range of not lower than a starting temperature of thermal decomposition of the polymer film to lower than an ending temperature of thermal decomposition of the polymer film.

3. The method as set forth in claim 1, wherein in the continuous carbonization step, at least one cooling space is provided.

4. The method as set forth in claim 1, wherein a difference in temperature between adjacent ones of the heating spaces falls within a range of not lower than 5° C. to not higher than 200° C.

5. The method as set forth in claim 1, wherein a rate of decrease in weight of the polymer film between before and after passing through each of the heating spaces is not higher than 25%.

6. The method as set forth in claim 1, wherein the polymer film to be subjected to the continuous carbonization step has a birefringence of not less than 0.10.

7. A method for producing a carbonized film, comprising a continuous carbonization step that includes subjecting a polymer film to two or more heating spaces each of which has a temperature that falls within a range of not lower than 500° C. to not higher than 900° C., so as to obtain a carbonized film.

8. The method as set forth in claim 7, wherein each of the heating spaces has a temperature that falls within a range of not lower than a starting temperature of thermal decomposition of the polymer film to lower than an ending temperature of thermal decomposition of the polymer film.

9. The method as set forth in claim 7, wherein in the continuous carbonization step, at least one cooling space is provided.

10. The method as set forth in claim 7, wherein a difference in temperature between adjacent ones of the heating spaces falls within a range of not lower than 5° C. to not higher than 200° C.

11. The method as set forth in claim 7, wherein a rate of decrease in weight of the polymer film between before and after passing through each of the heating spaces is not higher than 25%.

12. The method as set forth in claim 7, wherein the polymer film to be subjected to the continuous carbonization step has a birefringence of not less than 0.10.

* * * * *